(12) United States Patent
Yueh et al.

(10) Patent No.: US 10,674,606 B2
(45) Date of Patent: Jun. 2, 2020

(54) DISPLAY PANEL AND DISPLAY DEVICE

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 15/919,614

(22) Filed: Mar. 13, 2018

(65) Prior Publication Data

US 2019/0289717 A1    Sep. 19, 2019

(51) Int. Cl.
*H05K 1/14* (2006.01)
*H05K 1/11* (2006.01)

(52) U.S. Cl.
CPC .............. *H05K 1/142* (2013.01); *H05K 1/115* (2013.01); *H05K 2201/10128* (2013.01); *H05K 2201/10287* (2013.01)

(58) Field of Classification Search
CPC ................... H05K 1/142; H05K 1/115; H05K 2201/10128
See application file for complete search history.

(56) References Cited

U.S. PATENT DOCUMENTS

2015/0286457 A1* 10/2015 Kim ...................... G06F 3/1446
  345/581
2015/0370113 A1* 12/2015 Kim .................... G02F 1/13336
  361/679.21

* cited by examiner

*Primary Examiner* — William H. Mayo, III
*Assistant Examiner* — Hiram E Gonzalez
(74) *Attorney, Agent, or Firm* — Muncy, Geissler, Olds & Lowe, P.C.

(57) ABSTRACT

A display panel used for coupling to another display panel in a side by side manner is disclosed, which includes: a first substrate, including a first hole, a first surface and a second surface opposite to the first surface; a first conductive layer disposed on the first surface of the first substrate; a first circuit layer disposed on the second surface of the first substrate; a first connecting element disposed in the first hole and connecting the first conductive layer and the first circuit layer; and a first sealing layer disposed on the first conductive layer, wherein the first hole at least partially overlaps the first sealing layer. In addition, a display device comprising two display panels disposed adjacent to each other is also disclosed.

19 Claims, 8 Drawing Sheets

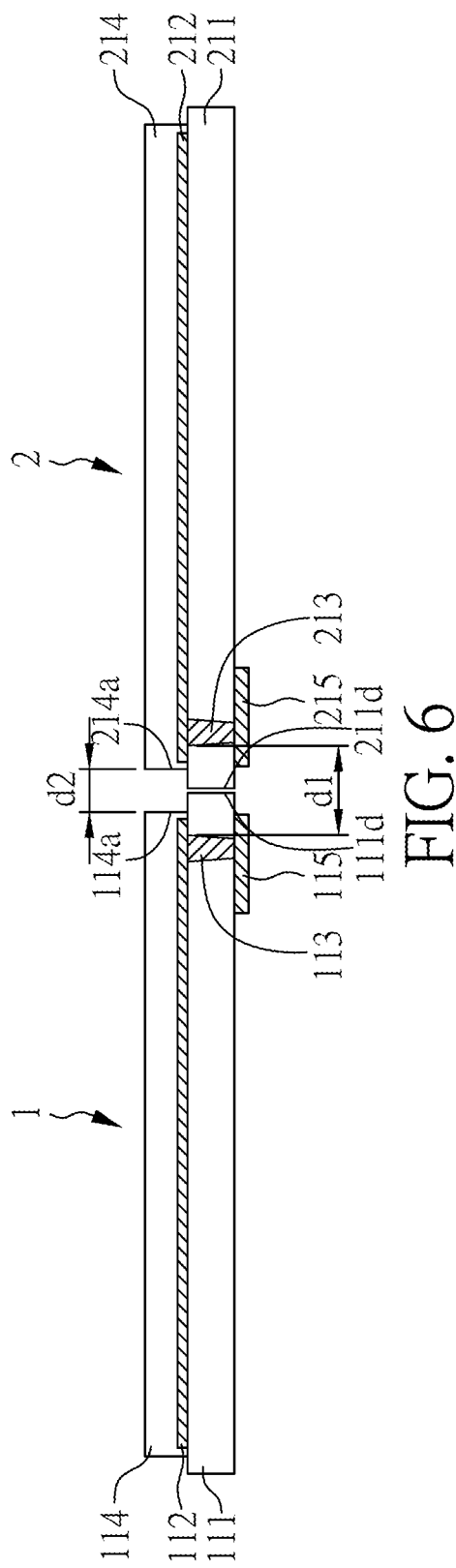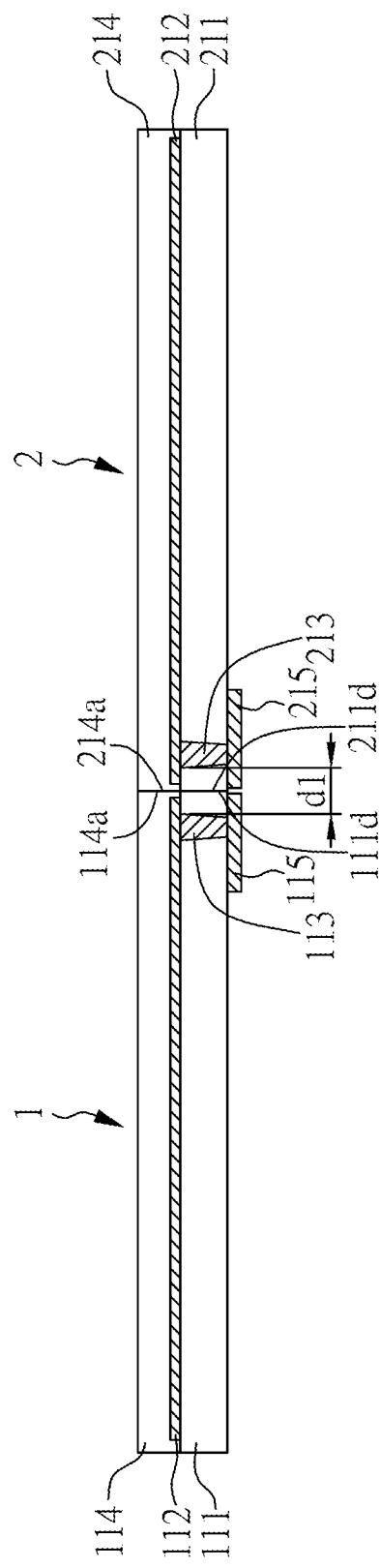

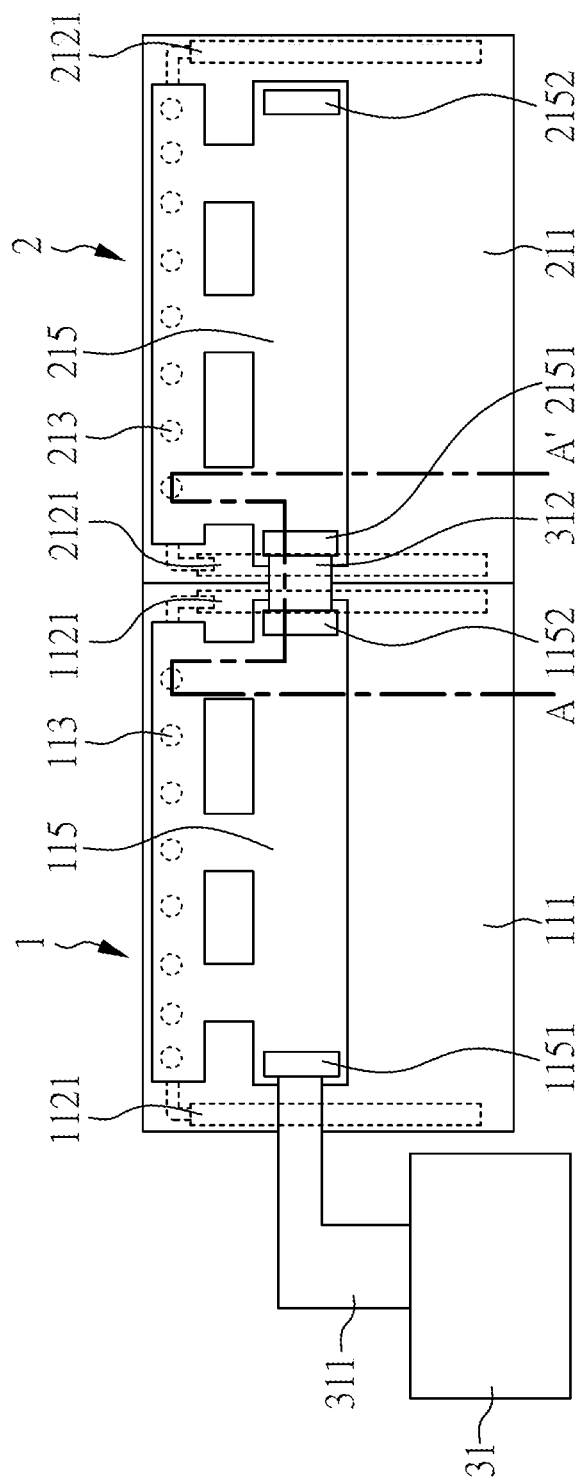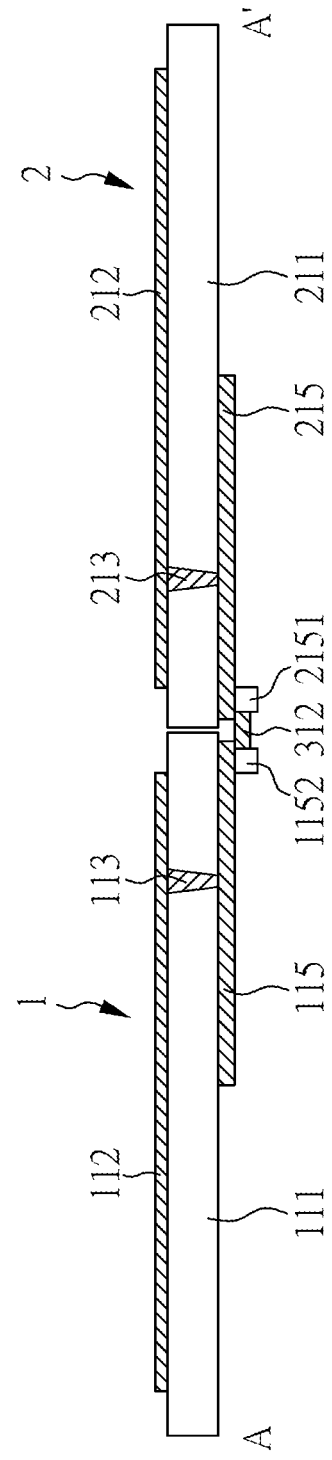
FIG. 8A
FIG. 8B

DISPLAY PANEL AND DISPLAY DEVICE

BACKGROUND

1. Field

The present disclosure relates to a display panel used for coupling to another display panel in a side by side manner, and also to a display device comprising two display panels disposed adjacent to each other.

2. Description of Related Art

With the continuous advancement of technologies related to electronic devices, all the electronic devices are now developed toward compactness, thinness, and lightness. For example, thin display devices are the mainstream display devices on the market. Even though the available electronic devices on the market are compact, thin or light, efforts are still needed. For example, in the display devices, the circuit arrangement in the border region still has to be optimized, to achieve the purpose of forming a display device with a narrow border region.

Hence, it is desirable to provide a display device with a narrow border region to meet the customer's requirement.

SUMMARY

The present disclosure provides a display panel used for coupling to another display panel in a side by side manner, comprising: a first substrate comprising a first hole, a first surface and a second surface opposite to the first surface; a first conductive layer disposed on the first surface of the first substrate; a first circuit layer disposed on the second surface of the first substrate; a first connecting element disposed in the first hole and connecting the first conductive layer and the first circuit layer; and a first sealing layer disposed on the first conductive layer, wherein the first hole at least partially overlaps the first sealing layer.

The present disclosure also provides a display device, comprising a first display panel and a second display panel disposed adjacent to the first display panel. The first display panel comprises: a first substrate comprising a first hole; a first conductive layer and a first circuit layer respectively disposed on opposite surfaces of the first substrate; a first connecting element disposed in the first hole and connecting the first conductive layer and the first circuit layer; and a first sealing layer disposed on the first conductive layer. The second display panel comprises: a second substrate comprising a second hole; a second conductive layer and a second circuit layer respectively disposed on opposite surfaces of the second substrate; a second connecting element disposed in the second hole and connecting the second conductive layer and the second circuit layer; and a second sealing layer disposed on the second conductive layer. Herein, a distance between the first connecting element and the second connecting element is equal to or greater than a distance between the first sealing layer and the second sealing layer.

The present disclosure further provides a display device, comprising a first display panel, a second display panel disposed adjacent to the first display panel, and a controller. The first display panel comprises: a first substrate comprising a first hole; a first conductive layer and a first circuit layer respectively disposed on opposite surfaces of the first substrate; and a first connecting element disposed in the first hole and connecting the first conductive layer and the first circuit layer. The second display panel comprises: a second substrate comprising a second hole; a second conductive layer and a second circuit layer respectively disposed on opposite surfaces of the second substrate; and a second connecting element disposed in the second hole and connecting the second conductive layer and the second circuit layer. Herein, the controller can transmit a signal to the second circuit layer via the first circuit layer.

Other novel features of the disclosure will become more apparent from the following detailed description when taken in conjunction with the accompanying drawings.

BRIEF DESCRIPTION OF THE DRAWINGS

FIG. 6 is a cross-sectional view of a display device according to Embodiment 4 of the present disclosure.

FIG. 7 is a cross-sectional view of a display device according to Embodiment 5 of the present disclosure.

FIG. 8A is a bottom view of a display device according to Embodiment 6 of the present disclosure.

FIG. 8B is a cross-sectional view of a display device according to Embodiment 6 of the present disclosure.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

In addition, the features in different embodiments of the present disclosure can be mixed to form another embodiment.

Embodiment 1

Figure 1:
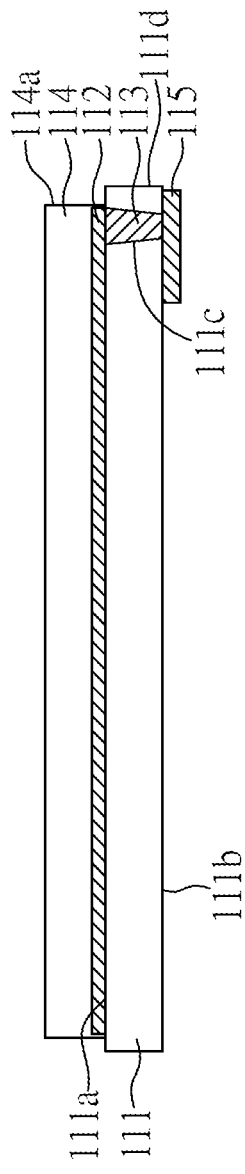
FIG. 1 is a cross-sectional view of a display panel according to Embodiment 1 of the present disclosure.

FIG. 1 is a cross-sectional view of a display panel according to the present embodiment. The display panel of the present embodiment can be used for coupling to another display panel in a side by side manner, which comprises: a first substrate 111, comprising a first hole 111c, a first surface 111a and a second surface 111b opposite to the first surface 111a; a first conductive layer 112, disposed on the first surface 111a of the first substrate 111; a first circuit layer 115, disposed on the second surface 111b of the first substrate 111; a first connecting element 113, disposed in the first hole 111c and connecting the first conductive layer 112 and the first circuit layer 115; and a first sealing layer 114 disposed on the first conductive layer 112. Herein, the first hole 111c penetrates the first substrate 111. The first hole 111c at least partially overlaps the first sealing layer 114 and, more particularly, the first hole 111c at least partially overlaps the first sealing layer 114 when observed in a normal direction of the first surface 111a of the first substrate 111.

In the display panel of the present embodiment, the first hole 111c penetrates the first substrate 111, and the first connecting element 113 disposed in the first hole 111c can connect the first conductive layer 112 and the first circuit layer 115 disposed at two opposite sides of the first substrate 111. In addition, the first hole 111c at least partially overlaps the first sealing layer 114. By the dispositions of the first connecting element 113 in the first hole 111c and the first hole 111c partially overlapping the first sealing layer 114, the width of the border region of the display panel can be greatly reduced, and even a borderless display panel can be achieved.

In the present embodiment, the first hole 111c or the first connecting element 113 at least partially overlap the first sealing layer 114 when observed in a normal direction of the first surface 111a of the first substrate 111. Especially, as shown in FIG. 1, the first hole 111c or the first connecting element 113 completely overlap the first sealing layer 114 when observed in a normal direction of the first surface 111a of the first substrate 111. However, the present disclosure is not limited thereto. In other embodiments of the present disclosure, as shown in FIG. 2 and FIG. 3, a part of the first hole 111c or a part of the first connecting element 113 overlap the first sealing layer 114 when observed in a normal direction of the first surface 111a of the first substrate 111.

In the present embodiment, the first substrate 111 may be a quartz substrate, a glass substrate, a sapphire substrate, a wafer substrate, a plastic substrate, other flexible substrates or films. When the first substrate 111 is a plastic substrate, a flexible substrate or films, the display panel of the present embodiment can be a flexible display panel. The material for first connecting element 113 may comprise any conductive material such as a metal or an alloy with high conductivity to reduce resistance or provide better electrical connection, such as Cu, Ag, Au or alloy thereof. The first conductive layer 112 may comprise, for example, a pixel electrode, a transistor, a data line, a gate line, a gate driving circuit, or a combination thereof. The first circuit layer 115 may comprises a bonding pad, a wire, a print circuit board (PCB), a flexible print circuit (FPC), a chip on film (COF) circuit, a tape carrier package (TCP) circuit, a chip on glass (COG) circuit, or a combination thereof.

Figure 2:
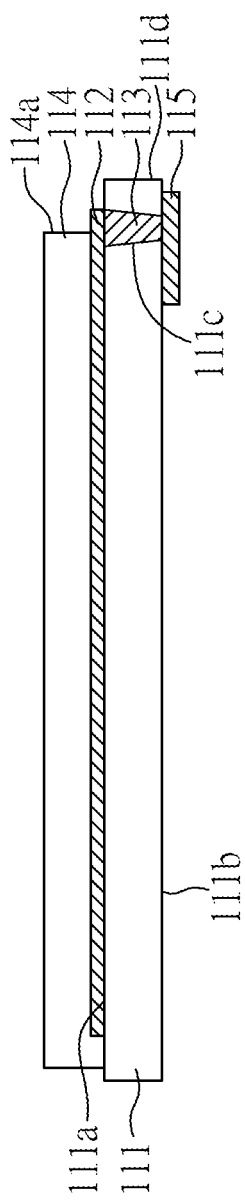
FIG. 2 and FIG. 3 are respectively a cross-sectional view of a display panel according other embodiments of the present disclosure.

In one aspect of the present disclosure, as shown in FIG. 1 and FIG. 2, the display panel may further comprises a display medium (not shown in the figure) between the first sealing layer 114 and the first conductive layer 112, and the display medium can be a self-emission display medium. Examples of the self-emission display medium may comprise organic light-emitting diodes (OLEDs), inorganic light-emitting diodes (LEDs), mini light-emitting diodes (mini-LEDs), micro light-emitting diodes (micro-LEDs), or quantum-dot light-emitting diodes (QLEDs). It will be understood that the chip size of the LED is 300 µm to 10 mm, the mini-LED is 100 µm to 300 µm, and the micro-LED is 1 µm to 100 µm. But the present disclosure is not limited thereto. The first sealing layer 114 used in the display panel of the present aspect may be an inorganic layer, an organic layer, or an inorganic-organic-inorganic (IOI) layer. It should be noted that, in the display panel shown in FIG. 1 or FIG. 2, the relative position between the first sealing layer 114 and the first hole 111c can be substituted with that shown in FIG. 3.

Figure 3:
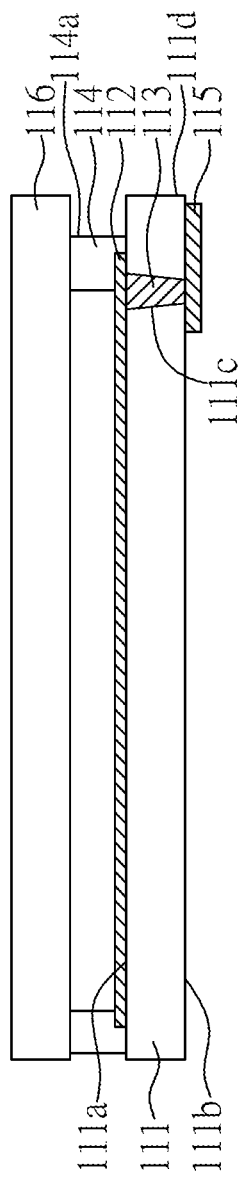

In another aspect of the present disclosure, as shown in FIG. 3, the display panel may further comprise: a counter substrate 116, and a display medium (not shown in the figure) disposed between the first conductive layer 112 and the counter substrate 116. Herein, the display medium can be the self-emission display medium as described above or a non-self-emission display medium. Example of the non-self-emission display medium may comprise liquid crystals (LCs) or electrophoresis material; thus, the first sealing layer 114 used in the display panel of the present aspect may be a sealant or a frit. In addition, examples of the counter substrate 116 are similar to those of the first substrate 111, and are not repeated again. It should be noted that, in the display panel shown in FIG. 3, the relative position between the first sealing layer 114 and the first hole 111c can be substituted with that shown in FIG. 1 or FIG. 2.

In the aspects shown in FIG. 1 to FIG. 3, the first sealing layer 114 has a first sealing edge 114a. The first substrate 111 has a first substrate edge 111d. The first sealing edge 114a is located on the first surface 111a of the first substrate 111. In other words, the first substrate edge 111d is separated from the first sealing edge 114a in a direction parallel to the first surface 111a of the first substrate 111 or in a direction perpendicular to the first surface 111a. However, in other embodiments of the present disclosure, the first substrate edge 111d may be approximately aligned with the first sealing edge 114a (see FIG. 5 and FIG. 7).

Hereinafter, the following embodiments illustrate how to arrange the display panels in a side by side manner to accomplish a display device with narrow bezel gap.

Embodiment 2

Figure 4:
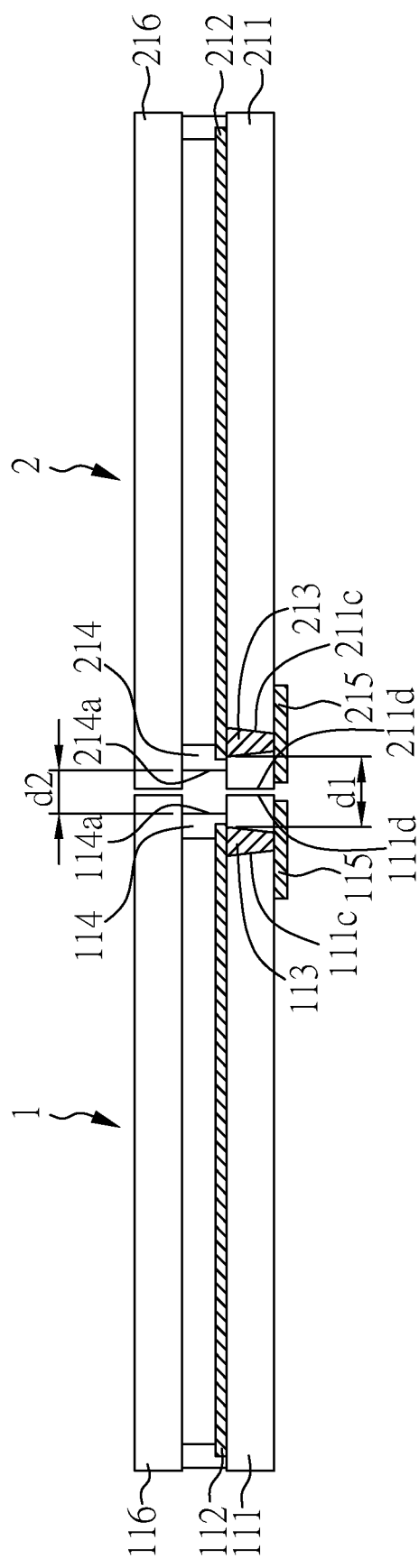
FIG. 4 is a cross-sectional view of a display device according to Embodiment 2 of the present disclosure.

FIG. 4 is a cross-sectional view of a display device according to the present embodiment. The display device of the present embodiment comprises: a first display panel 1; and a second display panel 2 disposed adjacent to the first display panel 1. Herein, the first display panel 1 comprises: a first substrate 111, comprising a first hole 111c; a first conductive layer 112 and a first circuit layer 115, respectively disposed on opposite surfaces of the first substrate 111; a first connecting element 113, disposed in the first hole 111c and connecting the first conductive layer 112 and the first circuit layer 115; and a first sealing layer 114 disposed on the first conductive layer 112. The second display panel 2 comprises: a second substrate 211, comprising a second hole 211c and disposed adjacent to the first substrate 111; a second conductive layer 212 and a second circuit layer 215, respectively disposed on opposite surfaces of the second substrate 211; a second connecting element 213, disposed in the second hole 211c and connecting the second conductive layer 212 and the second circuit layer 215; and a second sealing layer 214 disposed on the second conductive layer 212.

In the present embodiment, both the first display panel 1 and the second display panel 2 are display panels with two substrates (similar to that shown in FIG. 3), and the features of the first display panel 1 and the second display panel 2 are similar to the display panel illustrated in Embodiment 1. Hence, the relative descriptions of the first display panel 1 and the second display panel 2 are not repeated again.

In the aspect shown in FIG. 4, the first sealing layer 114 has a first sealing edge 114a. The first substrate 111 has a first substrate edge 111d. The first substrate edge 111d is separated from the first sealing edge 114a in a direction parallel to a surface the first substrate 111. The second sealing layer 214 has a second sealing edge 214a. The second substrate 211 has a second substrate edge 211d. The second substrate edge 211d is separated from the second sealing edge 114a in a direction parallel to a surface of the second substrate 211. In other words, the first sealing edge 114a retreats from the first substrate edge 111d, and the second sealing edge 214a retreats from the second substrate edge 211d. However, in other embodiments of the present disclosure, the first substrate edge 111d may be approximately aligned with the first sealing edge 114a, and the second substrate edge 211d may be approximately aligned with the second sealing edge 214a (see FIG. 5).

In the display device of the present embodiment, a distance d1 between the first connecting element 113 and the second connecting element 213 is equal to or greater than a distance d2 between the first sealing layer 114 and the second sealing layer 214. In the aspect shown in FIG. 4, the distance d1 is greater than the distance d2. In one aspect of the present embodiment, the distance d1 can be in a range from 300 μm to 3000 μm, and the distance d2 can be in a range from 30 μm to 300 μm. However, the present disclosure is not limited thereto.

In the present embodiment and the following embodiments, the distance d1 between the first connecting element 113 and the second connecting element 213 refers to a minimum distance between an edge of the first connecting element 113 and an edge of the second connecting element 213 either in a cross-sectional view or in a top view. In addition, the distance d2 between the first sealing layer 114 and the second sealing layer 214 refers to a minimum distance between an edge of the first sealing layer 114 and an edge of the second sealing layer 214 either in a cross-sectional view or in a top view.

In addition, in the present embodiment and the following embodiment, if the first sealing layer 114 and the second sealing layer 214 are respectively made by an IOI layer, the distance d2 between the first sealing layer 114 and the second sealing layer 214 refers to a minimum distance between the organic layer of the first sealing layer 114 and the organic layer of the second sealing layer 214.

In the present embodiment, the first conductive layer 112 electrically connects to the first circuit layer 115 via the first connecting element 113 disposed in the first hole 111c, the second conductive layer 212 electrically connects to the second circuit layer 215 via the second connecting element 213 disposed in the second hole 211c, the first hole 111c or the first connecting element 113 at least partially overlaps the first sealing layer 114 when observed in a normal direction of the first surface of the first substrate 111, and the second hole 211c or the second connecting element 213 at least partially overlaps the second sealing layer 214 when observed in a normal direction of the second surface of the second substrate 211; therefore, the widths of the border regions of the first display panel 1 and the second display panel 2 can be greatly reduced. When the first display panel 1 and the second display panel 2 with narrowed border regions are adjacently arranged, a display device with narrow bezel gap can be accomplished.

Embodiment 3

Figure 5:
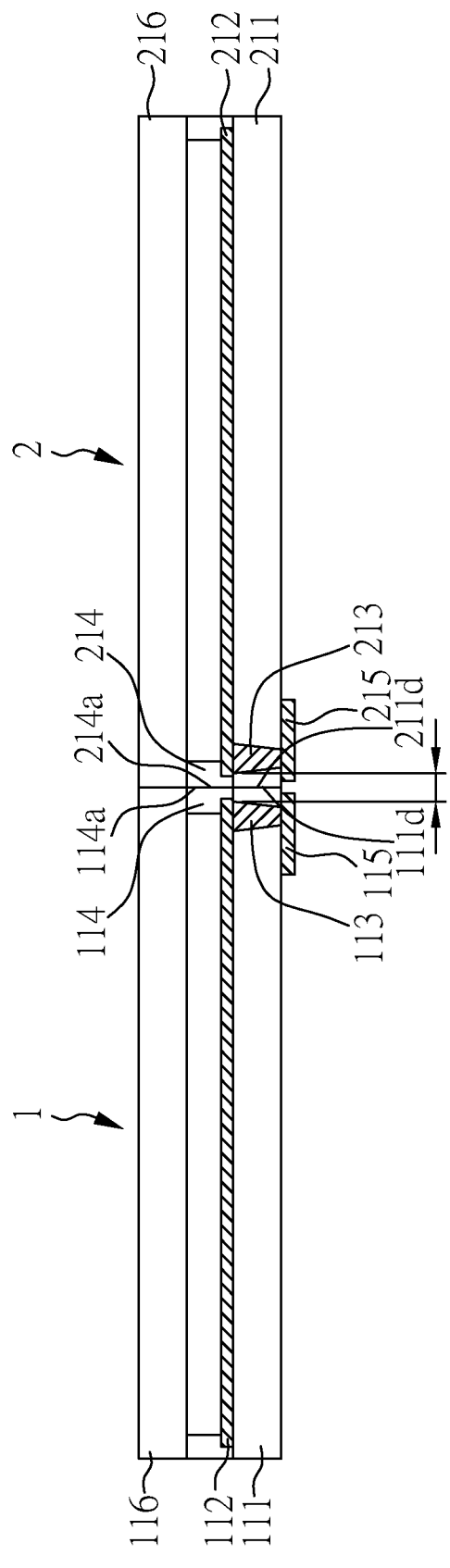
FIG. 5 is a cross-sectional view of a display device according to Embodiment 3 of the present disclosure.

FIG. 5 is a cross-sectional view of a display device according to the present embodiment. The display device of the present embodiment is similar to the display device of Embodiment 2, except for the following difference.

In Embodiment 2, as shown in FIG. 4, the first sealing layer 114 has a first sealing edge 114a located on a surface of the first substrate 111, and the second sealing layer 214 has a second sealing edge 214a located on a surface of the second substrate 211. In other words, the first sealing edge 114a is separated from the first substrate edge 111d, and the second sealing edge 214a is separated from the second substrate edge 211d. Hence, a greater than zero distance d2 exists between the first sealing edge 114a of the first sealing layer 114 and the second sealing edge 214a of the second sealing layer 214.

In the present embodiment, as shown in FIG. 5, the first substrate 111 has a first substrate edge 111d, the first sealing layer 114 has a first sealing edge 114a, and the first substrate edge 111d is approximately aligned with the first sealing edge 114a. In addition, the second substrate 211 has a second substrate edge 211d, the second sealing layer 214 has a second sealing edge 214a, and the second substrate edge 211d is approximately aligned with the second sealing edge 214a. In this case, the first sealing layer 114 can be very close to the second sealing layer 214, and almost no gap exists between the first sealing layer 114 and the second sealing layer 214, which means the distance d2 (shown in FIG. 4) between the first sealing layer 114 and the second sealing layer 214 is substantially zero, more specifically in a range from 0 to 1 μm. But the present disclosure is not limited thereto.

Embodiment 4

FIG. 6 is a cross-sectional view of a display device according to the present embodiment. The display device of the present embodiment is similar to the display device of Embodiment 2, except for the following difference.

In Embodiment 2, as shown in FIG. 4, both the first display panel 1 and the second display panel 2 are display panels with two substrates. In the present embodiment, as shown in FIG. 6, both the first display panel 1 and the second display panel 2 are display panels with one substrate (similar to that shown in FIG. 1 or FIG. 2). The features of the first display panel 1 and the second display panel 2 are similar to the display panel illustrated in Embodiment 1. Hence, the relative descriptions of the first display panel 1 and the second display panel 2 are not repeated again.

Similar to Embodiment 2, in the display device of the present embodiment, a distance d1 between the first connecting element 113 and the second connecting element 213 is equal to or greater than a distance d2 between the first sealing layer 114 and the second sealing layer 214. In the aspect shown in FIG. 6, the distance d1 is greater than the distance d2.

Embodiment 5

FIG. 7 is a cross-sectional view of a display device according to the present embodiment. The display device of the present embodiment is similar to the display device of Embodiment 3, except for the following difference.

In Embodiment 3, as shown in FIG. 5, both the first display panel 1 and the second display panel 2 are display panels with two substrates. In the present embodiment, as shown in FIG. 7, both the first display panel 1 and the second display panel 2 are display panels with one substrate (similar to that shown in FIG. 1 or FIG. 2). The features of the first display panel 1 and the second display panel 2 are similar to the display panel illustrated in Embodiment 1. Hence, the relative descriptions of the first display panel 1 and the second display panel 2 are not repeated again.

Similar to Embodiment 3, in the present embodiment, the first sealing layer 114 can be very close to the second sealing layer 214, and almost no gap exists between the first sealing layer 114 and the second sealing layer 214, which means the distance d2 (shown in FIG. 6) between the first sealing layer 114 and the second sealing layer 214 is substantially zero, more specifically in a range from 0 to 1 μm. But the present disclosure is not limited thereto.

Hereinafter, the following embodiments illustrate how to drive the display panels arranged side by side. Any one of the display devices shown in Embodiment 2 to Embodiment 5 can be applied to the following embodiments; therefore, only the features which have not been illustrated before are described below, and the detail descriptions about the display panels mentioned before are not repeated again.

Embodiment 6

FIG. 8A is a bottom view of a display device according to the present embodiment, and FIG. 8B is a cross-sectional view according to the line A-A' indicated in FIG. 8A.

The display device of the present embodiment further comprises: a controller 31 transmitting a signal to the second circuit layer 215 via the first circuit layer 115.

More specifically, the display device of the present embodiment further comprises: a controller 31; a first connecting wire 311 electrically connecting the controller 31 and a terminal 1151 of the first circuit layer 115; and a second connecting wire 312 electrically connecting another terminal 1152 of the first circuit layer 115 and a terminal 2151 of the second circuit layer 215. When the controller 31 supply a signal, the signal is transmitted to the first circuit layer 115 via the first connecting wire 311 bonding to the terminal 1151 of the first circuit layer 115. The signal received by the first circuit layer 115 can transmit to the first conductive layer 112 via the first connecting element 113, to drive the first conductive layer 112. For example, the first conductive layer 112 may comprise at least one gate driving circuit 1121. In addition, the signal received by the first circuit layer 115 can further transmit to the second circuit layer 215 via the second connecting wire 312 bonding to both the terminal 1152 of the first circuit layer 115 and the terminal 2151 of the second circuit layer 215. The signal received by the second circuit layer 215 can transmit to the second conductive layer 212 via the second connecting element 213, to drive the second conductive layer 212. For example, the second conductive layer 212 may comprise at least one gate driving circuit 2121. Because the first circuit layer 115 electrically connects to the second circuit layer 215 via the second connecting wire 312, one signal supplied by the controller 31 can transmit to both the first circuit layer 115 and the second circuit layer 215. It could be understood that the signal received by the first circuit layer 115 can directly transmit to the second circuit layer 215 or can be processed and then transmit to the second circuit layer 215.

Embodiment 7

Figure 9:
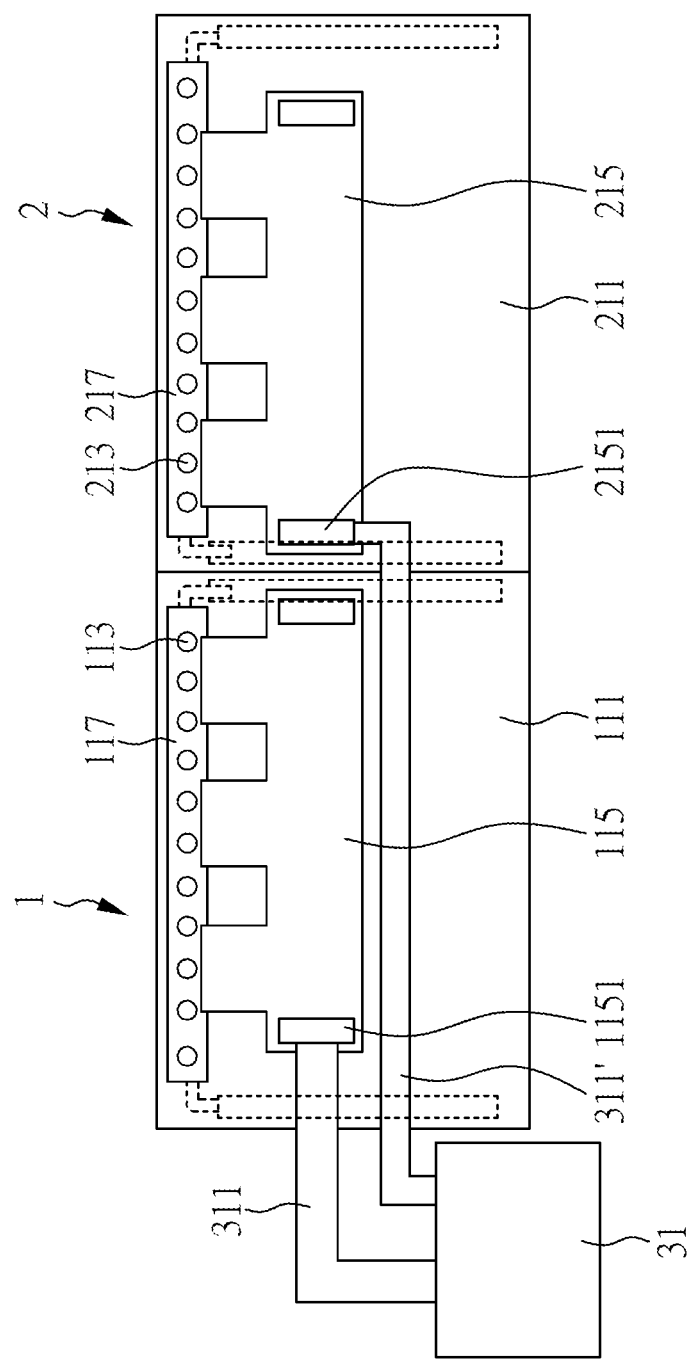
FIG. 9 is a bottom view of a display device according to Embodiment 7 of the present disclosure.

FIG. 9 is a bottom view of a display device according to the present embodiment. The display device of the present embodiment is similar to the display device of Embodiment 6, except for the signal supplying method of the controller.

The display device of the present embodiment further comprises: a controller 31 transmitting a first signal to the first circuit layer 115 and a second signal to the second circuit layer 215, wherein the first signal is independent of the second signal.

More specifically, the display device of the present embodiment further comprises: a controller 31; a first connecting wire 311 electrically connecting the controller 31 and a terminal 1151 of the first circuit layer 115; and a third connecting wire 311' electrically connecting the controller 31 and a terminal 2151 of the second circuit layer 215. Herein, the controller 31 can supply two independent signals (i.e. the first signal and the second signal). When the controller 31 supply a first signal, the first signal is transmitted to the first circuit layer 115 via the first connecting wire 311 bonding to the terminal 1151 of the first circuit layer 115. The signal received by the first circuit layer 115 can transmit to the first conductive layer 112 (not shown in FIG. 9) via the first connecting element 113, to drive the first conductive layer 112. In addition, the controller 31 also supply a second signal, the second signal is transmitted to the second circuit layer 215 via the third connecting wire 311' bonding to the terminal 2151 of the second circuit layer 215. The second signal received by the second circuit layer 215 can transmit to the second conductive layer 212 (not shown in FIG. 9) via the second connecting element 213, to drive the second conductive layer 212.

In the present embodiment, the first display panel 1 may further comprise a first pad 117, which electrically connects the first connecting element 113 and the first circuit layer 115. In addition, the second display panel 2 may also comprise a second pad 217, which electrically connects the second connecting element 213 and the second circuit layer 215. The material for the first pad 117 and the second pad 217 can respectively be, for example, a metal or an alloy (such as Cu, Ag, Au or alloy thereof), or a metal oxide (such as ITO, IZO, ITZO, IGZO, AZO or a combination thereof).

In other embodiments of the present disclosure, the display device shown in FIG. 8 or FIG. 9 may further comprise a third display panel (not shown in the figure), wherein the first display panel 1, the second display panel 2 and the third display panel are arranged in a row, the second display panel 2 is disposed between the first display panel 1 and the third display panel, and the signal may be transmitted from the second circuit layer 215 to a third circuit layer (not shown in the figure) of the third display panel. The method for transmitting the signal from the second circuit layer 215 to the third circuit layer is similar to the method for transmitting the signal from the first circuit layer 115 to the second circuit layer 215 illustrated before.

Embodiment 8

Figure 10:
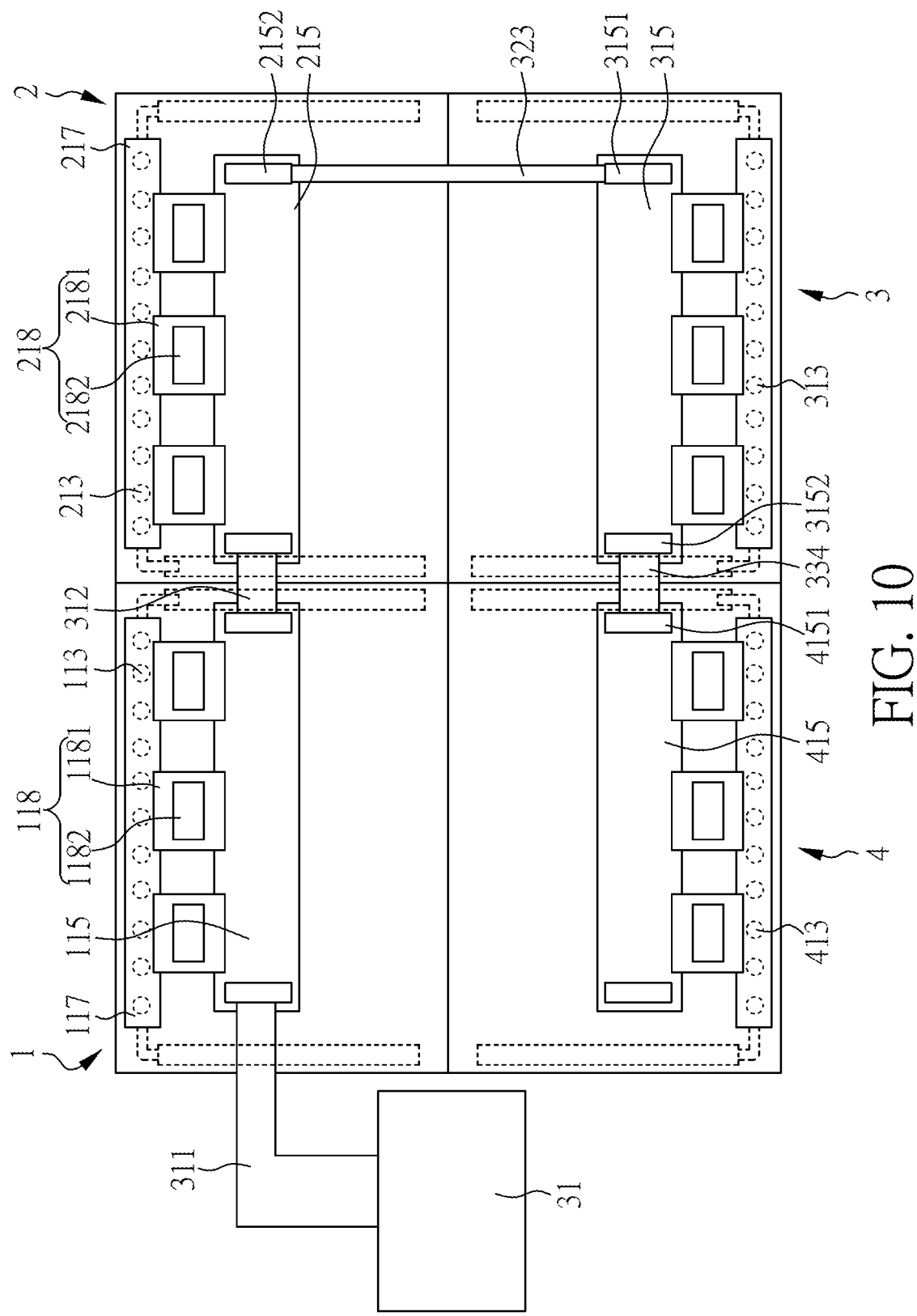
FIG. 10 is a bottom view of a display device according to Embodiment 8 of the present disclosure.

FIG. 10 is a bottom view of a display device according to the present embodiment. The display device of the present embodiment is similar to the display device of Embodiment 6, except for the following differences.

In the present embodiment, the display device further comprises: a third display panel 3 and a fourth display panel 4, wherein the first display panel 1, the second display panel 2, the third display panel 3 and the fourth display panel 4 are arranged in a 2×2 array. However, in other embodiments of the present disclosure, the arrangement of the first display panel 1, the second display panel 2, the third display panel 3 and the fourth display panel 4 are not limited thereto.

Herein, the first display panel 1 may further comprise a first pad 117 electrically connecting to the first connecting element 113, and the first circuit layer 115 electrically connects to the first pad 117 via a connecting member 118. Similarly, the second display panel 1 may also comprise a second pad 217 electrically connecting to the second connecting element 213, and the second circuit layer 215 electrically connects to the second pad 217 via another connecting member 218. The connecting members 118, 218 respectively comprise a film 1181, 2181 and an integrated circuit (IC) 1182, 2182 disposed thereon. Therefore, the connecting members 118, 218 are also called as COFs (chip on film), but the present disclosure is not limited thereto.

The structures of the third display panel 3 and the fourth display panel 4 are similar to the structures of the first display panel 1 and the second display panel 2, so the descriptions thereof are not repeated again.

In the present embodiment, the signal transmission from the first display panel 1 to the second display panel 2 is similar to that shown in Embodiment 6. A terminal 2152 of the second circuit layer 215 electrically connects to a terminal 3151 of a third circuit layer 315 of the third display panel 3 via a connecting wire 323, and then the signal transmitted from the second circuit layer 215 to the third circuit layer 315 can further transmit to a third conductive layer (not shown in the figure) via a third connecting element 313 of the third display panel 3 to drive the third conductive layer. In addition, a terminal 3152 of the third circuit layer 315 electrically connects to a terminal 4151 of a fourth circuit layer 415 of the fourth display panel 4 via a connecting wire 334, and then the signal transmitted from the third circuit layer 315 to the fourth circuit layer 415 can further transmit to a fourth conductive layer (not shown in the figure) via a fourth connecting element 413 of the fourth display panel 4 to drive the fourth conductive layer.

Embodiment 9

Figure 11:
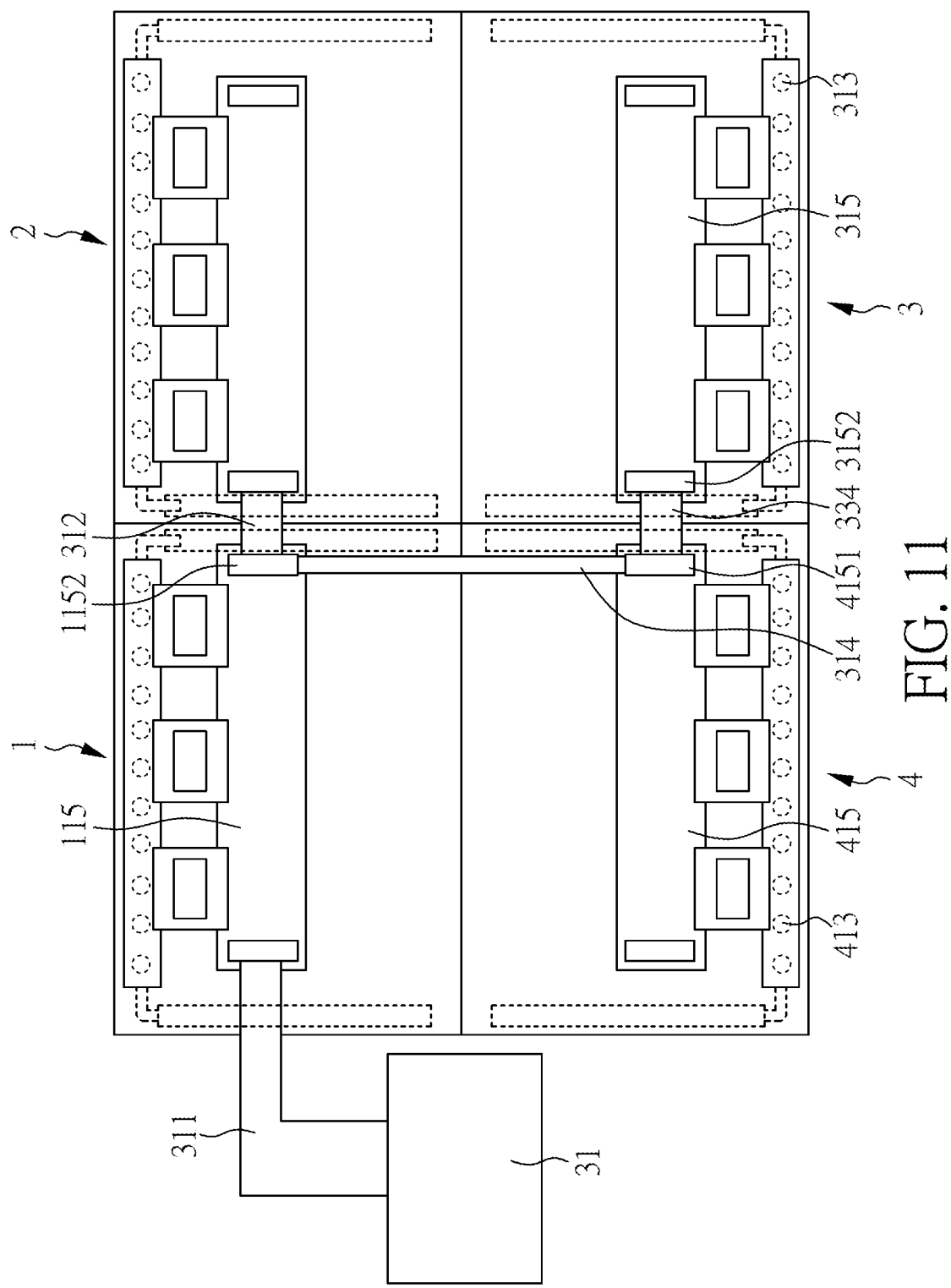
FIG. 11 is a bottom view of a display device according to Embodiment 9 of the present disclosure.

FIG. 11 is a bottom view of a display device according to the present embodiment. The display device of the present embodiment is similar to the display device of Embodiment 8, except for the following differences.

In the present embodiment, the signal transmission from the first display panel 1 to the second display panel 2 is similar to that shown in Embodiment 8. A terminal 1152 of the first circuit layer 115 electrically connects to a terminal 4151 of a fourth circuit layer 415 of the fourth display panel 4 via a connecting wire 314, and then the signal transmitted from the first circuit layer 115 to the fourth circuit layer 415 can further transmit to a fourth conductive layer (not shown in the figure) via a fourth connecting element 413 of the fourth display panel 4 to drive the fourth conductive layer. In addition, a terminal 4151 of the fourth circuit layer 415 electrically connects to a terminal 3152 of a third circuit layer 315 of the third display panel 3 via a connecting wire 334, and then the signal transmitted from the fourth circuit layer 415 to the third circuit layer 315 can further transmit to a third conductive layer (not shown in the figure) via a third connecting element 313 of the third display panel 3 to drive the third conductive layer.

Embodiment 10

Figure 12:
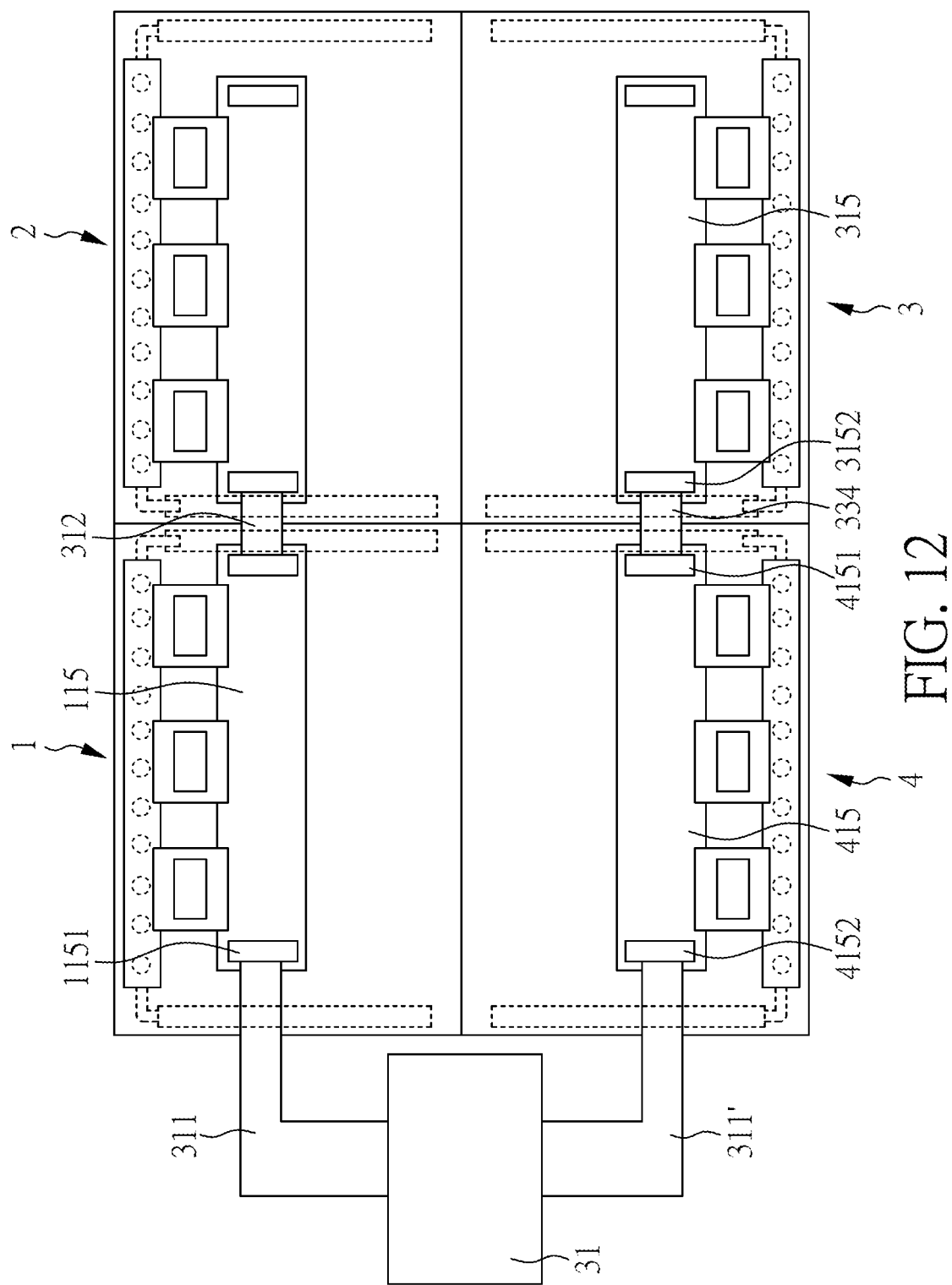
FIG. 12 is a bottom view of a display device according to Embodiment 10 of the present disclosure.

FIG. 12 is a bottom view of a display device according to the present embodiment. The display device of the present embodiment is similar to the display device of Embodiment 8, except for the following differences.

In the present embodiment, the controller 31 supply a first signal, the first signal is transmitted to the first circuit layer 115 via the first connecting wire 311 bonding to the terminal 1151 of the first circuit layer 115. In addition, the controller 31 also supply a second signal, the second signal is transmitted to a fourth circuit layer 415 of the fourth display panel 4 via a third connecting wire 311' bonding to a terminal 4152 of the fourth circuit layer 415.

The signal transmission from the first display panel 1 to the second display panel 2 is similar to that shown in Embodiment 8, and the signal transmission from the fourth display panel 4 to the third display panel 3 is similar to that shown in Embodiment 9. Thus, the descriptions thereof are not repeated again.

In Embodiment 6 to Embodiment 10, the signal supplied by the controller 31 is transmitted via the first connecting wire 311 or the third connecting wire 311'. However, the present disclosure is not limited thereto. In other embodiments of the present disclosure, the signal supplied by the controller 31 is transmitted to the first circuit layer by a wireless network. The wireless network can be but not limited to one of several types of wireless network such as Wireless PAN, Wireless LAN, Wireless ad hoc network, Wireless MAN, Wireless WAN, Cellular network, Global area network, and Space network.

The display panel and the display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display panel used for coupling to another display panel in a side by side manner, comprising:
   a first substrate comprising a first hole, a first surface and a second surface opposite to the first surface;
   a first conductive layer disposed on the first surface of the first substrate;
   a first circuit layer disposed on the second surface of the first substrate;
   a first connecting element disposed in the first hole and connecting the first conductive layer and the first circuit layer;
   a first sealing layer disposed on the first conductive layer; and
   a counter substrate disposed on the first sealing layer,
   wherein the first hole at least partially overlaps the first sealing layer.

2. The display panel of claim 1, wherein the first substrate has a first substrate edge, the first sealing layer has a first sealing edge, and the first substrate edge is aligned with the first sealing edge.

3. The display panel of claim 1, wherein the first substrate has a first substrate edge, the first sealing layer has a first sealing edge, and the first substrate edge is separated from the first sealing edge.

4. A display device, comprising:
a first display panel, comprising:
a first substrate comprising a first hole;
a first conductive layer and a first circuit layer respectively disposed on opposite surfaces of the first substrate;
a first connecting element disposed in the first hole and connecting the first conductive layer and the first circuit layer;
a first sealing layer disposed on the first conductive layer; and
a first counter substrate disposed on the first sealing layer; and
a second display panel disposed adjacent to the first display panel and comprising:
a second substrate comprising a second hole;
a second conductive layer and a second circuit layer respectively disposed on opposite surfaces of the second substrate;
a second connecting element disposed in the second hole and connecting the second conductive layer and the second circuit layer;
a second sealing layer disposed on the second conductive layer; and
a second counter substrate disposed on the second sealing layer,
wherein a distance between the first connecting element and the second connecting element is greater than a distance between the first sealing layer and the second sealing layer.

5. The display device of claim 4, wherein the first hole at least partially overlaps the first sealing layer.

6. The display device of claim 4, wherein the second hole at least partially overlaps the second sealing layer.

7. The display device of claim 4, further comprising a controller transmitting a signal to the first circuit layer by a wireless network and transmitting the signal to the second circuit layer via the first circuit layer.

8. The display device of claim 7, wherein the first circuit layer electrically connects to the second circuit layer.

9. The display device of claim 4, further comprising a controller transmitting a first signal to the first circuit layer and transmitting a second signal to the second circuit layer.

10. The display device of claim 9, wherein the first signal is independent of the second signal.

11. The display device of claim 4, wherein the first substrate has a first substrate edge, the first sealing layer has a first sealing edge, and the first substrate edge is aligned with the first sealing edge.

12. The display device of claim 4, wherein the second substrate has a second substrate edge, the second sealing layer has a second sealing edge, and the second substrate edge is aligned with the second sealing edge.

13. The display device of claim 4, wherein the first substrate has a first substrate edge, the first sealing layer has a first sealing edge, the second substrate has a second substrate edge, the second sealing layer has a second sealing edge, and the first substrate edge is separated from the first sealing edge, and the second substrate edge is separated from the second sealing edge.

14. A display device, comprising:
a first display panel, comprising:
a first substrate comprising a first hole;
a first conductive layer and a first circuit layer respectively disposed on opposite surfaces of the first substrate;
a first connecting element disposed in the first hole and connecting the first conductive layer and the first circuit layer; and
a first sealing layer disposed on the first conductive layer;
a second display panel disposed adjacent to the first display panel and comprising:
a second substrate comprising a second hole;
a second conductive layer and a second circuit layer respectively disposed on opposite surfaces of the second substrate;
a second connecting element disposed in the second hole and connecting the second conductive layer and the second circuit layer; and
a second sealing layer disposed on the second conductive layer;
a controller transmitting a signal to the second circuit layer via the first circuit layer; and
a connecting wire electrically connecting the controller and the first circuit layer,
wherein a distance between the first connecting element and the second connecting element is greater than a distance between the first sealing layer and the second sealing layer.

15. The display device of claim 14, wherein the first hole at least partially overlaps the first sealing layer.

16. The display device of claim 14, wherein the second hole at least partially overlaps the second sealing layer.

17. The display device of claim 14, wherein the first substrate has a first substrate edge, the first sealing layer has a first sealing edge, and the first substrate edge is aligned with the first sealing edge.

18. The display device of claim 14, wherein the second substrate has a second substrate edge, the second sealing layer has a second sealing edge, and the second substrate edge is aligned with the second sealing edge.

19. The display device of claim 14, wherein the first substrate has a first substrate edge, the first sealing layer has a first sealing edge, the second substrate has a second substrate edge, the second sealing layer has a second sealing edge, and the first substrate edge is separated from the first sealing edge, and the second substrate edge is separated from the second sealing edge.

* * * * *